(12) United States Patent
Matsumoto

(10) Patent No.: US 9,484,714 B2
(45) Date of Patent: Nov. 1, 2016

(54) METHOD FOR MANUFACTURING OPTICAL SEMICONDUCTOR DEVICE HAVING MODULATOR WITH HOLLOWED REGIONS BETWEEN WAVEGUIDES

(71) Applicant: Mitsubishi Electric Corporation, Tokyo (JP)

(72) Inventor: Keisuke Matsumoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/925,514

(22) Filed: Oct. 28, 2015

(65) Prior Publication Data
US 2016/0268768 A1    Sep. 15, 2016

(30) Foreign Application Priority Data

Mar. 11, 2015  (JP) .................... 2015-048615

(51) Int. Cl.
| | |
|---|---|
| *H01S 5/20* | (2006.01) |
| *H01L 21/308* | (2006.01) |
| *H01S 5/22* | (2006.01) |
| *H01S 5/026* | (2006.01) |
| *H01S 5/02* | (2006.01) |
| *G02B 6/136* | (2006.01) |
| *G02F 1/225* | (2006.01) |
| *G02F 1/17* | (2006.01) |

(Continued)

(52) U.S. Cl.
CPC ............ *H01S 5/2081* (2013.01); *G02B 6/136* (2013.01); *G02F 1/17* (2013.01); *G02F 1/2257* (2013.01); *H01L 21/308* (2013.01); *H01S 5/026* (2013.01); *H01S 5/0206* (2013.01); *H01S 5/22* (2013.01); *G02B 2006/12078* (2013.01); *G02B 2006/12097* (2013.01); *G02F 2001/212* (2013.01)

(58) Field of Classification Search
CPC ........ H01S 5/026; H01S 5/0206; H01S 5/22; H01S 5/2081; G02B 6/136; G02F 1/17; G02F 1/2257; H01L 21/308
See application file for complete search history.

(56) References Cited

U.S. PATENT DOCUMENTS

| | | | | |
|---|---|---|---|---|
| 2011/0235960 | A1* | 9/2011 | Yamatoya | G02F 1/2257 385/2 |
| 2011/0235961 | A1* | 9/2011 | Hashimoto | G02F 1/2257 385/3 |
| 2011/0235971 | A1* | 9/2011 | Hashimoto | B82Y 20/00 385/31 |

(Continued)

FOREIGN PATENT DOCUMENTS

| | | |
|---|---|---|
| JP | H08-162706 A | 6/1996 |
| JP | 2002-270946 A | 9/2002 |

(Continued)

*Primary Examiner* — Michael Jung
(74) *Attorney, Agent, or Firm* — Studebaker & Brackett PC

(57) ABSTRACT

A second insulating film, which includes a hollowed portion inside in a region where the high mesa ridge type optical element is formed, is formed. By using the second insulating film as a mask and etching, a concave portion is formed in the transparent waveguide layer and the upper cladding layer below the hollowed portion. The modulator layer having the Al-based material is formed. By etching with the modulator layer formed in the concave portion being covered with the third insulating film, the modulator layer formed outside the concave portion is removed. By etching with the modulator layer formed in the concave portion being covered with the fourth insulating film, the ridge of the semiconductor laser is formed without exposing the modulator layer formed in the concave portion.

6 Claims, 6 Drawing Sheets

(51) Int. Cl.
*G02F 1/21* (2006.01)
*G02B 6/12* (2006.01)

(56) References Cited

U.S. PATENT DOCUMENTS

2011/0243491 A1* 10/2011 Hashimoto ............. G02F 1/035
                                                                    385/3
2011/0305255 A1   12/2011 Ishimura et al.
2013/0272326 A1* 10/2013 Yamatoya ................. H01S 3/10
                                                                    372/26
2015/0043867 A1*  2/2015 Kono .................... G02F 1/2257
                                                                    385/3
2015/0185582 A1*  7/2015 Kwakernaak ......... G02F 1/2257
                                                                    438/69
2015/0331298 A1* 11/2015 Yagi ..................... G02F 1/2257
                                                                    385/2

FOREIGN PATENT DOCUMENTS

JP        2011-253989 A      12/2011
JP           5573386 B2       8/2014

* cited by examiner

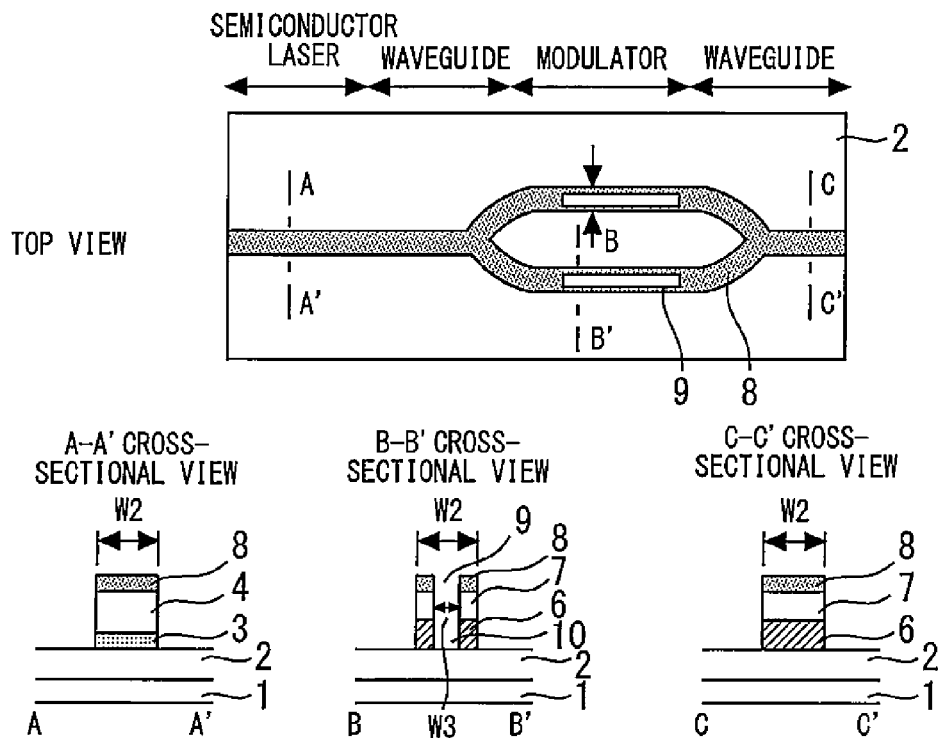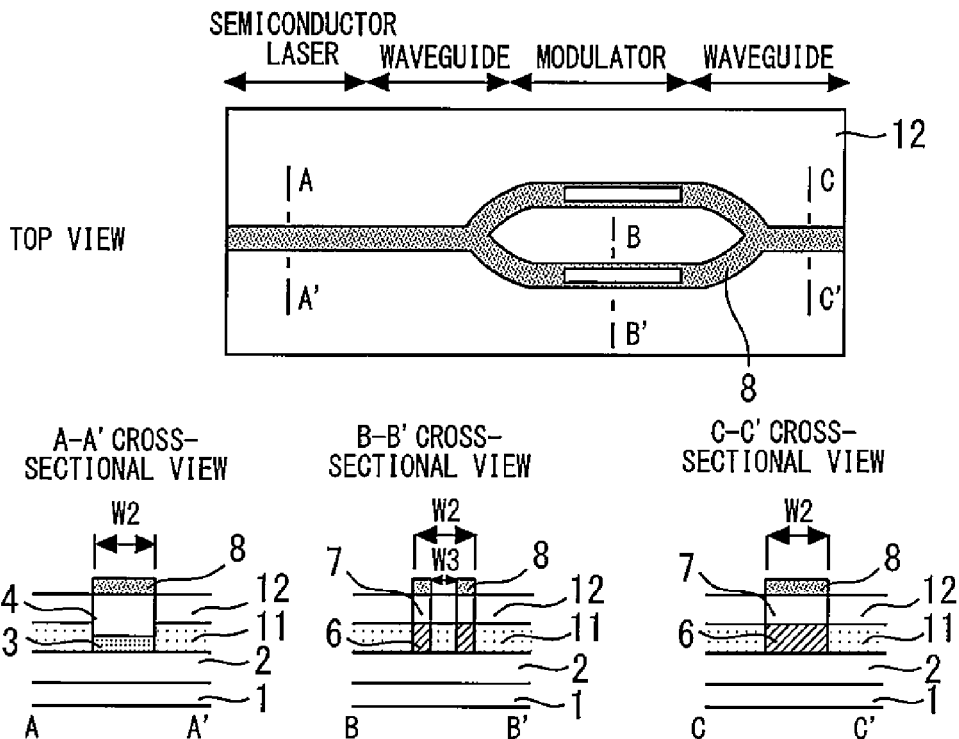

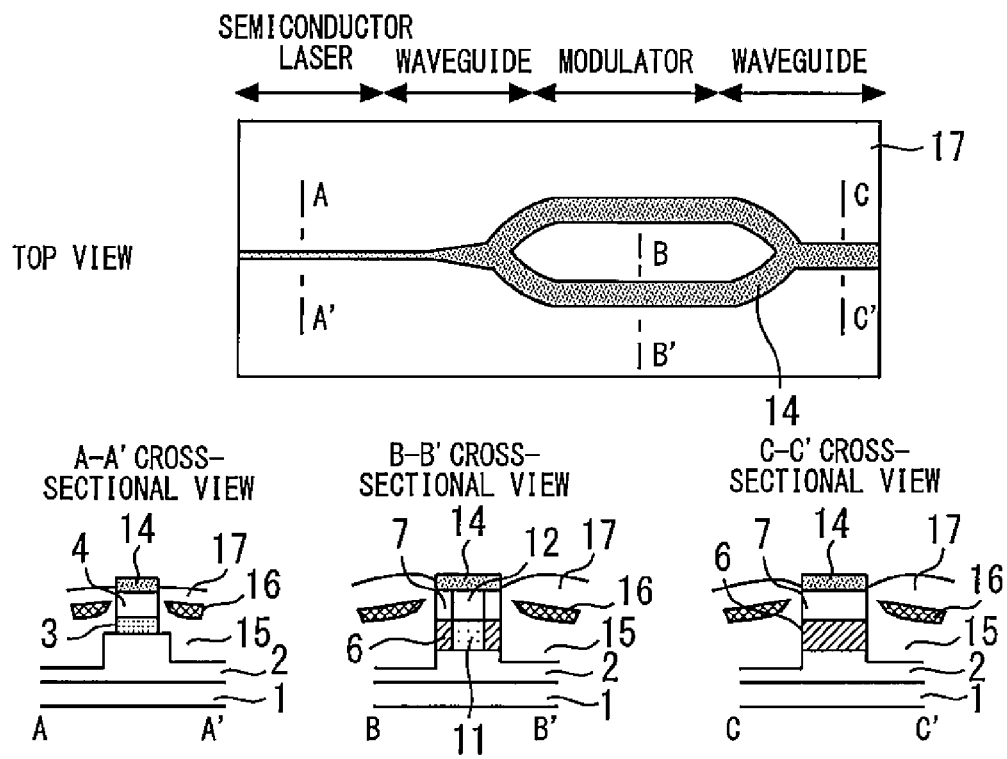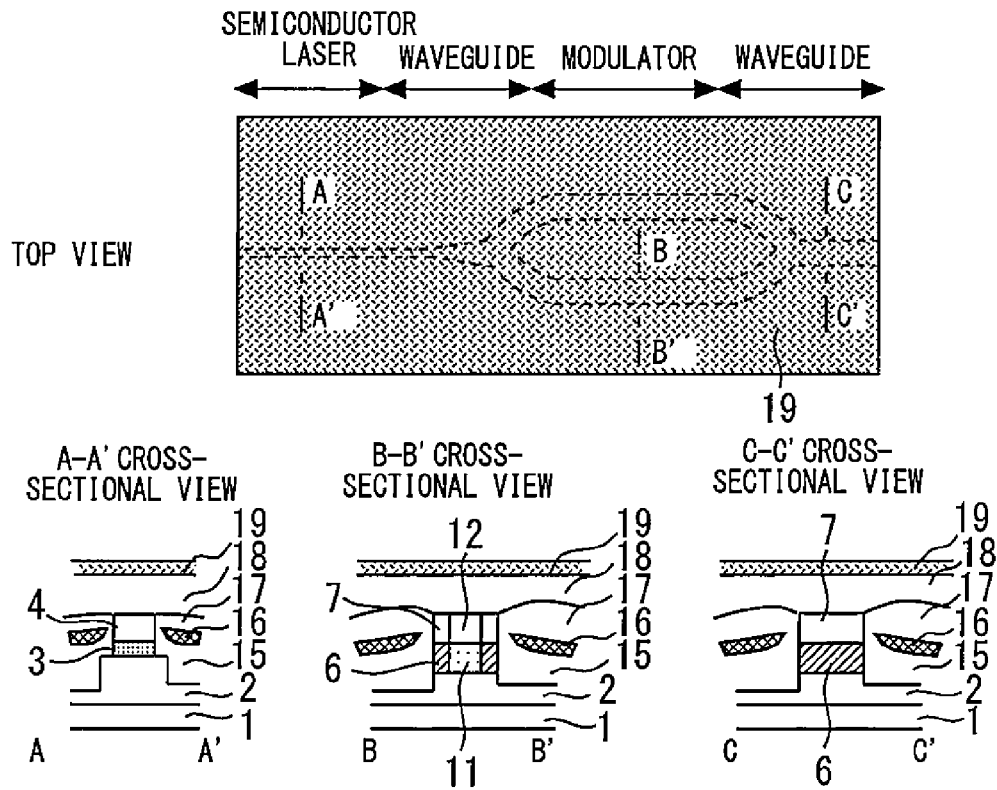

METHOD FOR MANUFACTURING OPTICAL SEMICONDUCTOR DEVICE HAVING MODULATOR WITH HOLLOWED REGIONS BETWEEN WAVEGUIDES

BACKGROUND OF THE INVENTION

1. Field of the Invention

The present invention relates to a method for manufacturing an integrated optical semiconductor device mainly applicable to an optical communication field.

2. Background Art

Japanese Patent Laid-Open No. 2002-270946 and Japanese Patent Laid-Open No. 08-162706 disclose examples in which a semiconductor laser and an optical element are integrated together. Japanese Patent Laid-Open No. 2011-253989 discloses an example of an optical element in which a semiconductor laser including an embedded layer and a modulator including a high mesa ridge using an Al-based material are integrated together.

SUMMARY OF THE INVENTION

When forming a semiconductor laser ridge through dry etching, the conventional methods for manufacturing an optical semiconductor device remove an unnecessary part of the modulator by etching. At the time of etching, the Al-based material of the modulator flies and adheres to a side face of an active layer of the semiconductor laser. After that, both sides of the semiconductor laser ridge are filled with embedded layers. The Al-based material is adhered to the side face of the active layer of the semiconductor laser in this way, resulting in a problem that reliability deteriorates.

The present invention has been implemented to solve the above-described problem, and it is an object of the present invention to provide a method for manufacturing an optical semiconductor device capable of preventing, when forming a ridge of an embedded type optical element, an Al-based material of a high mesa ridge type optical element from flying and adhering to a side face of a core layer and improving reliability.

According to the present invention, a method for manufacturing an optical semiconductor device in which an embedded type optical element using an Al-free based material, a high mesa ridge type optical element using an Al-based material, and a waveguide connecting the embedded type optical element to the high mesa ridge type optical element are integrated together, includes: forming a lower cladding layer, a first core layer using an Al-free based material, and a first upper cladding layer on a substrate in that order; in a region where the embedded type optical element is formed, forming a first insulating film on the first upper cladding layer; using the first insulating film as a mask and etching the first core layer and the first upper cladding layer; in a region other than the first insulating film, selectively forming a second core layer using an Al-free based material, and a second upper cladding layer on the lower cladding layer in that order; after the first insulating film is removed, in a region where the embedded type optical element, the high mesa ridge type optical element and the waveguide are formed, on the first and second upper cladding layer, forming a second insulating film including a hollowed portion inside in a region where the high mesa ridge type optical element is formed; using the second insulating film as a mask and etching the first and second core layers and the first and second upper cladding layers to form a concave portion in the second core layer and the second upper cladding layer below the hollowed portion; in a region other than the second insulating film, selectively forming a third core layer using an Al-based material, and a third upper cladding layer on the lower cladding layer in that order; after the second insulating film is removed, in a region where the embedded type optical element, the high mesa ridge type optical element, and the waveguide are formed, forming a third insulating film on the first, second and third upper cladding layers and covering the third core layer and the third upper cladding layer formed in the concave portion with the third insulating film; using the third insulating film as a mask and etching the first, second and third core layers and the first, second and third upper cladding layers to remove the third core layer and the third upper cladding layer formed outside the concave portion; after the third insulating film is removed, in a region where the embedded type optical element, the high mesa ridge type optical element, and the waveguide are formed, forming a fourth insulating film on the first, second and third upper cladding layers and covering the third core layer and the third upper cladding layer formed in the concave portion with the fourth insulating film; using the fourth insulating film as a mask and etching the first and second core layers and the first and second upper cladding layers to form a ridge of the embedded type optical element without exposing the third core layer and the third upper cladding layer formed in the concave portion; in a region other than the fourth insulating film, forming an embedded layer on the lower cladding layer and filling both sides of the ridge of the embedded type optical element with the embedded layer;

after the fourth insulating film is removed, in a region where the embedded type optical element, the high mesa ridge type optical element and the waveguide are formed, forming a fifth insulating film on the first, second and third upper cladding layers and the embedded layer; and using the fifth insulating film as a mask and etching the second and third core layers, the second and third upper cladding layers and the embedded layer to form a high mesa ridge of the high mesa ridge type optical element.

In the present invention, the core layer of the modulator layer having an Al-based material is not etched when the semiconductor laser ridge is formed, and it is thereby possible to prevent the Al-based material of the modulator from flying and adhering to the side face of the active layer of the semiconductor laser and improve reliability.

Other and further objects, features and advantages of the invention will appear more fully from the following description.

BRIEF DESCRIPTION OF THE DRAWINGS

FIGS. 1 to 13 are top views and cross-sectional views illustrating a method for manufacturing an optical semiconductor device according to an embodiment of the present invention.

DETAILED DESCRIPTION OF THE PREFERRED EMBODIMENTS

FIGS. 1 to 13 are top views and cross-sectional views illustrating a method for manufacturing an optical semiconductor device according to an embodiment of the present invention. An optical semiconductor device in which a semiconductor laser, a modulator and a waveguide connecting the two are integrated together is manufactured using the manufacturing method of the present embodiment. The semiconductor laser is an embedded type optical element using an Al-free based material and the modulator is a high mesa ridge type optical element using an Al-based material.

Figure 1:
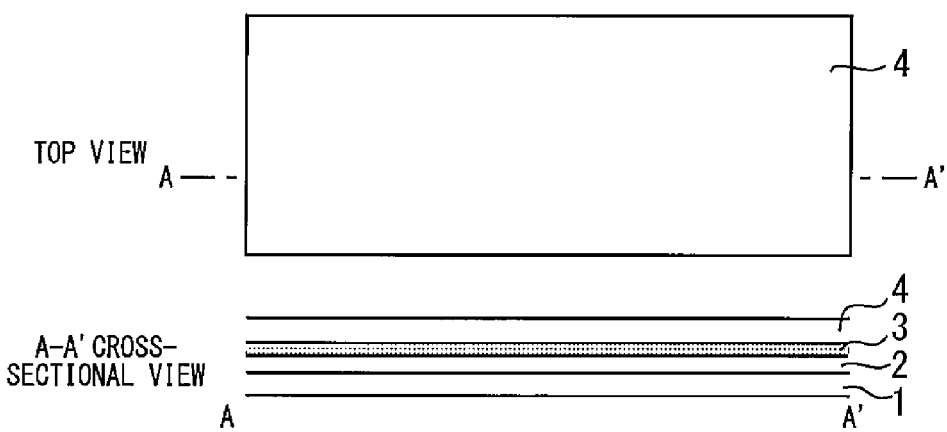

First, as shown in FIG. 1, an n-InP lower cladding layer 2, an active layer 3 made of an Al-free based material (e.g., InGaAsP material) and a p-InP upper cladding layer 4 are made to grow on an n-InP substrate 1 in that order.

Figure 2:
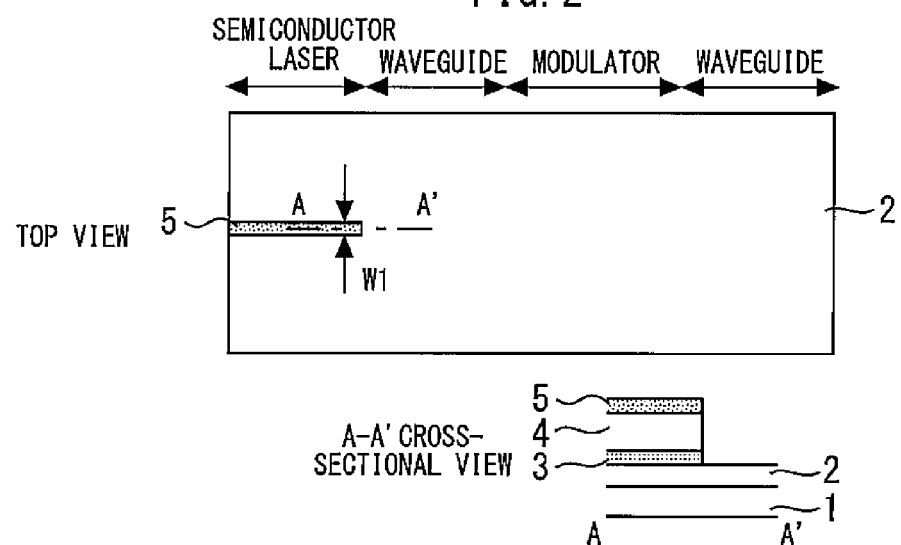

Next, as shown in FIG. 2, a first insulating film 5 having a width of W1 is formed on the p-InP upper cladding layer 4 in a region where the semiconductor laser is formed. Using the first insulating film 5 as a mask, the active layer 3 and the p-InP upper cladding layer 4 are etched. The width W1 is on the order of 10 μm.

Figure 3:
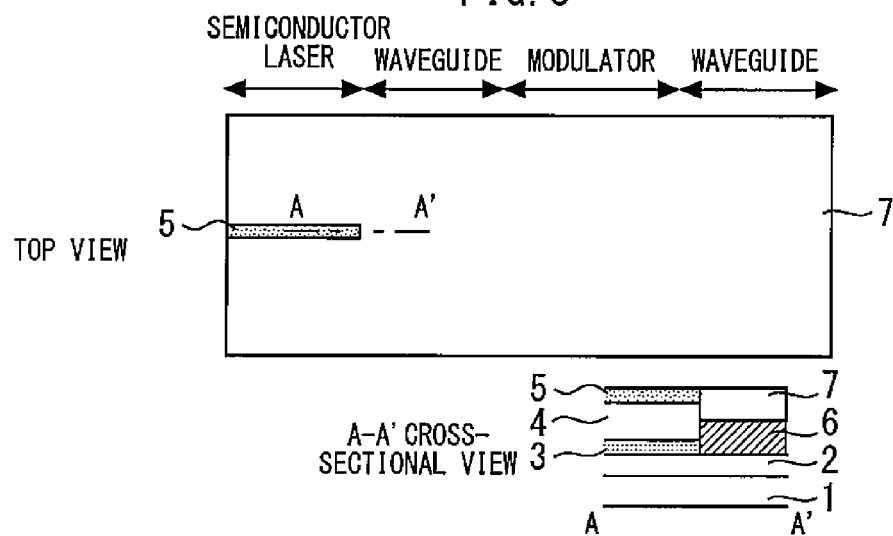

Next, as shown in FIG. 3, a transparent waveguide layer 6 made of an Al-free based material (e.g., InGaAsP material) and a p-InP upper cladding layer 7 are made to selectively grow on the n-InP lower cladding layer 2 in that order in regions other than the first insulating film 5. After that, the first insulating film 5 is removed.

Next, as shown in FIG. 4, a second insulating film 8 having a width of W2 is formed on the p-InP upper cladding layers 4 and 7 in regions where the semiconductor laser, modulator and waveguide are formed. The second insulating film 8 includes a hollowed portion 9 having a width of W3 which is smaller than the width W2 inside a region where the modulator is formed, or more specifically, at two arm sections of an MZ (Mach-Zehnder). The width W2 is on the order of 20 μm and the width W3 is on the order of 15 μm.

Using the second insulating film 8 as a mask, the active layer 3, the transparent waveguide layer 6 and the p-InP upper cladding layers 4 and 7 are etched. In this case, a concave portion 10 is formed in the transparent waveguide layer 6 and the p-InP upper cladding layer 7 below the hollowed portion 9.

Next, as shown in FIG. 5, a modulator layer 11 having an Al-based material (e.g., AlGaInAs material) and a p-InP upper cladding layer 12 are made to selectively grow on the n-InP lower cladding layer 2 in that order in regions other than the second insulating film 8. In this case, the modulator layer 11 and the p-InP upper cladding layer 12 are also formed in the concave portion 10. After that, the second insulating film 8 is removed.

Figure 6:
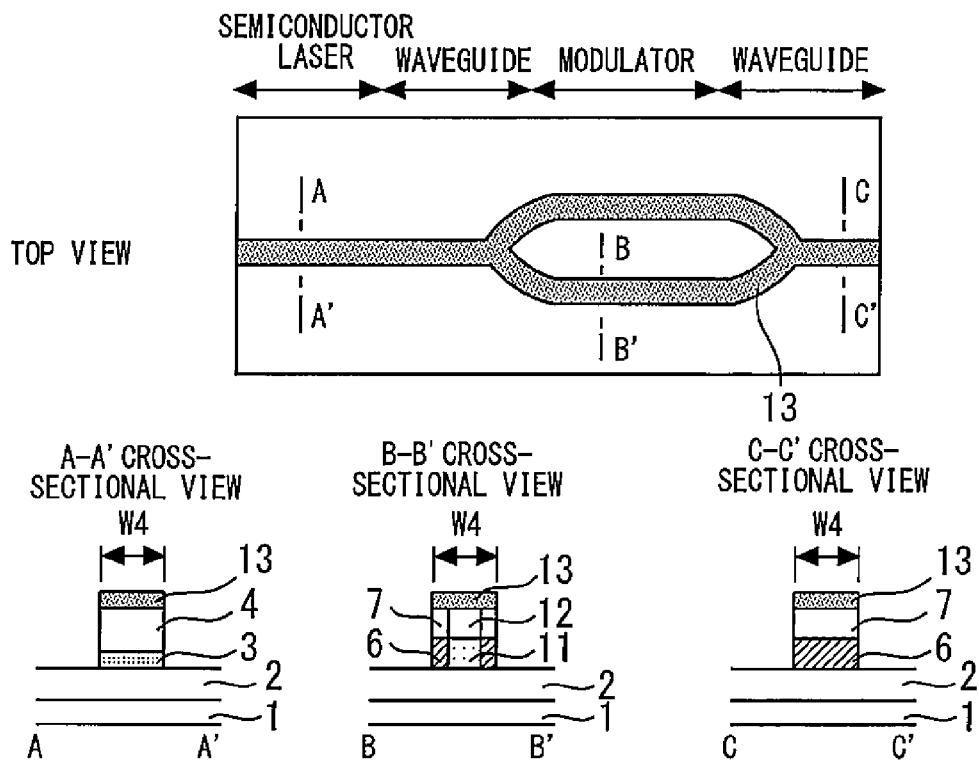

Next, as shown in FIG. 6, a third insulating film 13 having a width of W4 which is larger than the width W3 is formed on the p-InP upper cladding layers 4, 7 and 12 in regions where the semiconductor laser, modulator and waveguide are formed. In this case, the modulator layer 11 and the p-InP upper cladding layer 12 formed in the concave portion 10 are covered and hermetically sealed with the third insulating film 13. The width W4 is on the order of 18 μm.

Using the third insulating film 13 as a mask, the active layer 3, transparent waveguide layer 6, the modulator layer 11 and the p-InP upper cladding layers 4, 7 and 12 are dry-etched and the modulator layer 11 and the p-InP upper cladding layer 12 formed outside the concave portion 10 are removed. After that, the third insulating film 13 is removed.

Figure 7:
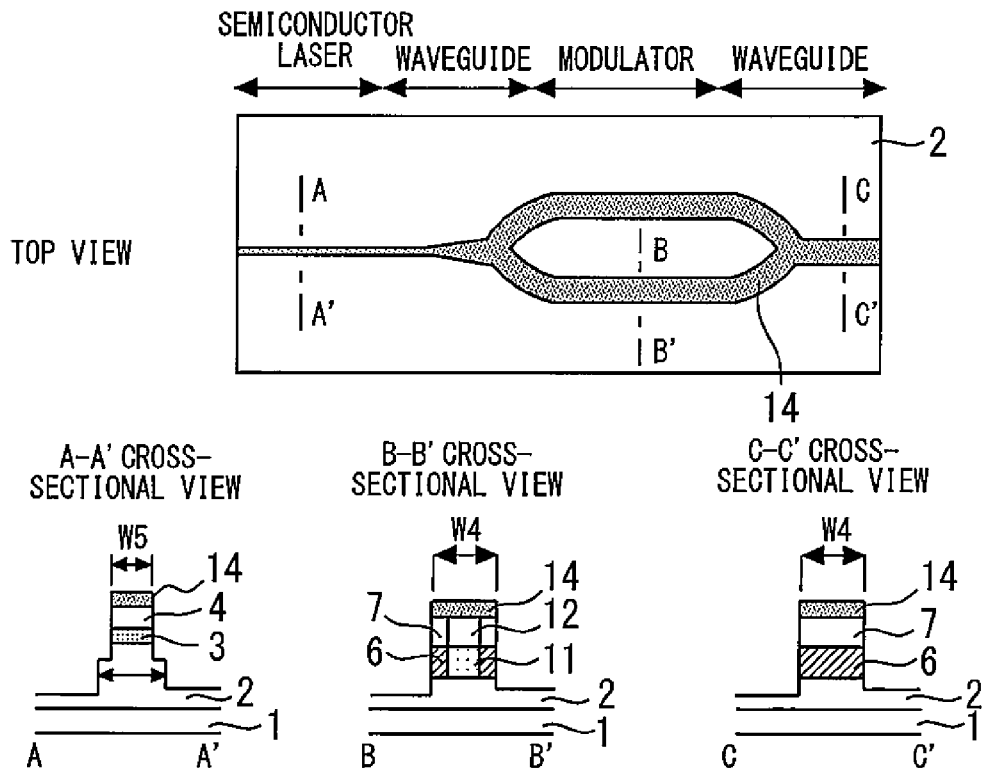

Next, as shown in FIG. 7, a fourth insulating film 14 is newly formed on the p-InP upper cladding layers 4, 7 and 12 in the regions where the semiconductor laser, modulator and waveguide are formed. In this case, the modulator layer 11 and the P-InP upper cladding layer 12 formed in the concave portion 10 are covered and hermetically sealed with the fourth insulating film 14. The width of the fourth insulating film 14 is W5 in the region where the semiconductor laser is formed and W4 in the region where the modulator and waveguide are formed. The width W5 is on the order of 2 μm and this is a final finish size.

Using the fourth insulating film 14 as a mask, the active layer 3, the transparent waveguide layer 6 and the p-InP upper cladding layers 4 and 7 are etched. In this way, a semiconductor laser ridge is formed without exposing the modulator layer 11 and the p-InP upper cladding layer 12 formed in the concave portion 10.

Next, as shown in FIG. 8, an p-InP embedded layer 15, an n-InP embedded layer 16 and a p-InP embedded layer 17 are embedded and made to grow on the n-InP lower cladding layer 2 in that order in regions other than the fourth insulating film 14 and both sides of the semiconductor laser ridge are filled with these embedded layers. After that, the fourth insulating film 14 is removed.

Figure 10:
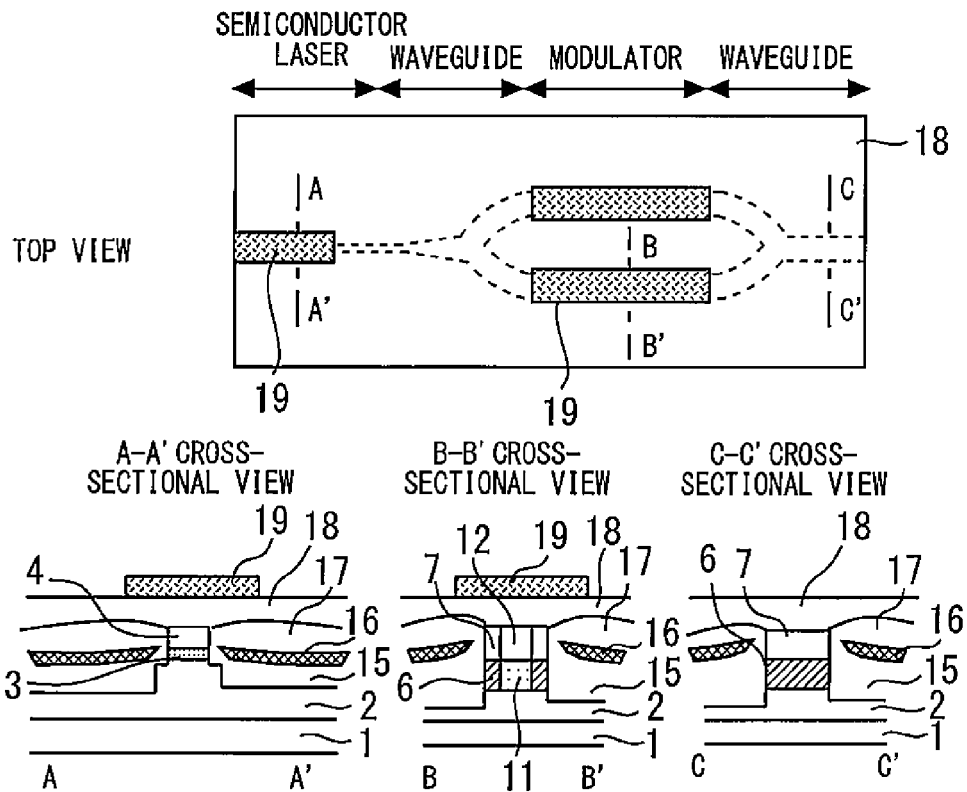

Next, as shown in FIG. 9, a p-InP cladding layer 18 and a p-InGaAs contact layer 19 are made to grow on the entire surface in that order. Next, as shown in FIG. 10, the p-InGaAs contact layer 19 other than the region where an electrode is formed (arm section of the MZ making up the semiconductor laser and the modulator) is selectively removed.

Figure 11:
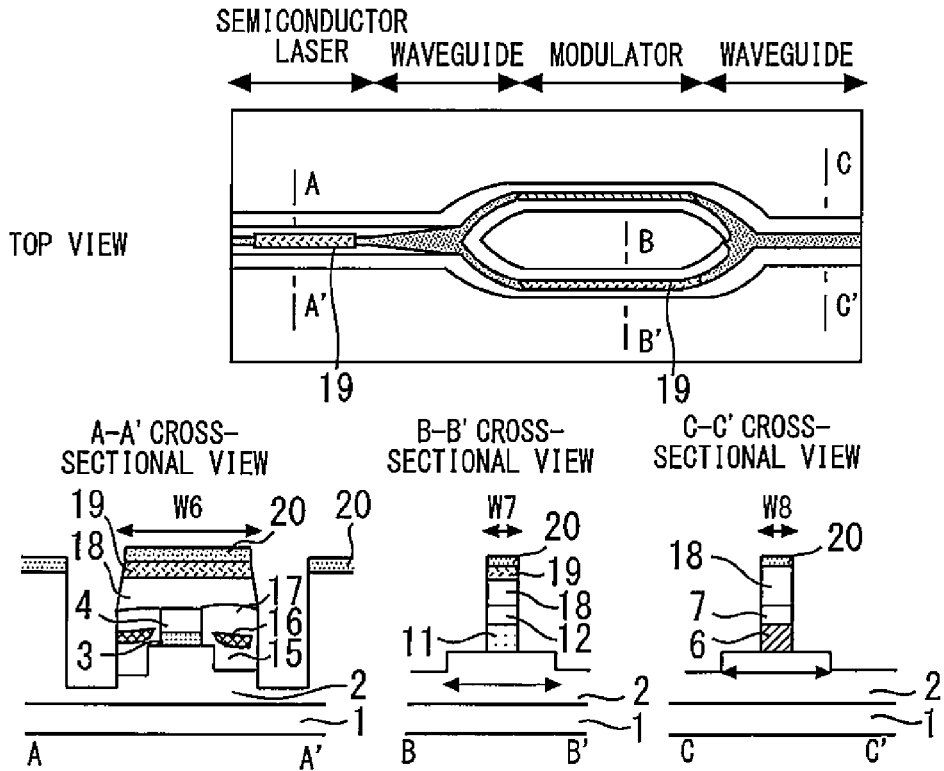

Next, as shown in FIG. 11, a fifth insulating film 20 is formed on the p-InP upper cladding layers 4, 7 and 12, and the p-InP embedded layer 17 in regions where the semiconductor laser, modulator and waveguide are formed. Using the fifth insulating film 20 as a mask, the transparent waveguide layer 6, the modulator layer 11, p-InP upper cladding layers 7 and 12 and the embedded layer are etched, and a mesa of the semiconductor laser and high mesa ridges of the modulator and the waveguide are formed. A width W6 of the mesa of the semiconductor laser is on the order of 10 μm and widths W7 and W8 of the high mesa ridges of the modulator and the waveguide are on the order of 2 μm.

Figure 12:
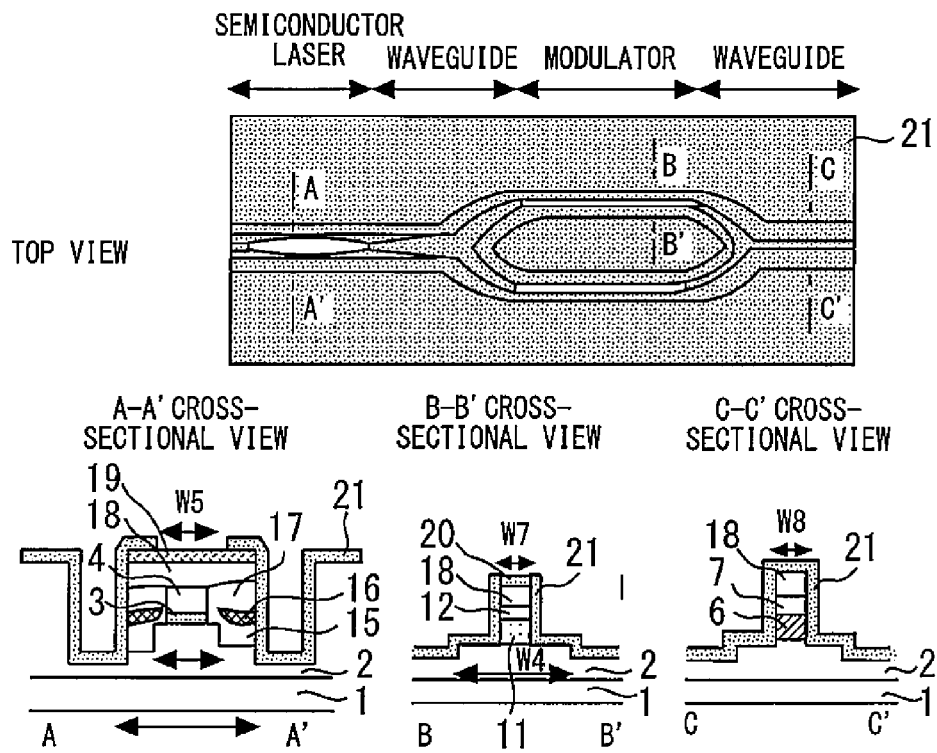
Figure 13:
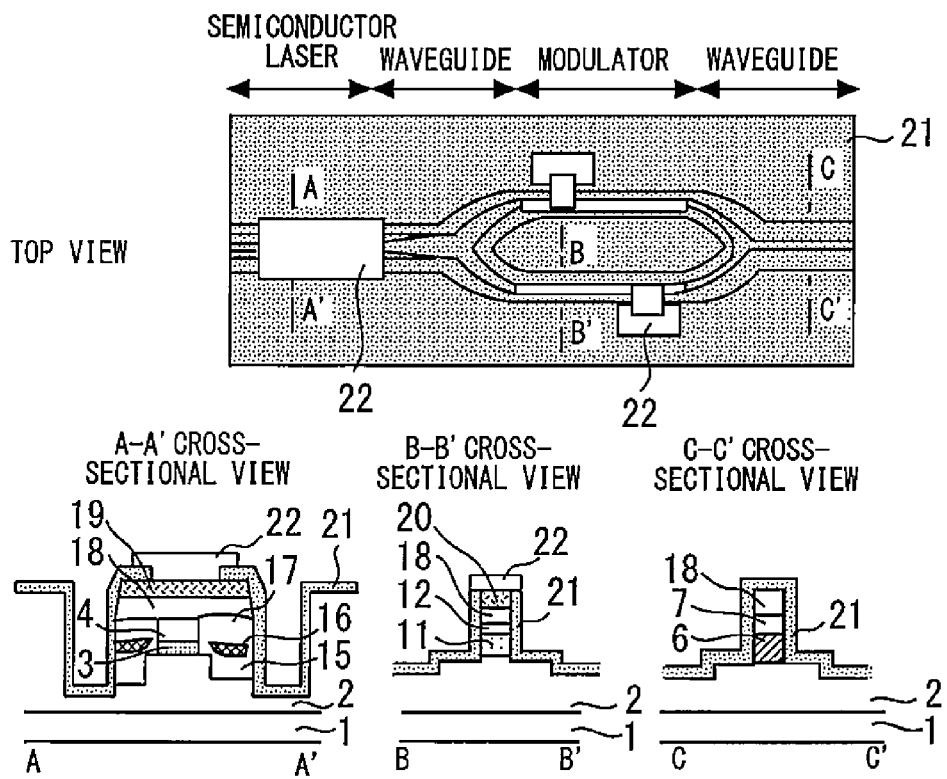

Next, as shown in FIG. 12, an insulating film 21 is formed on the entire surface and an opening is formed in the insulating film 21 in the electrode contact portion on the mesa. Next, as shown in FIG. 13, a surface electrode 22 is formed in the opening of the insulating film 21. After that, the entire wafer is polished to a thickness on the order of 100 μm and a back electrode (not shown) is formed on the back of the wafer.

As described so far, in the present embodiment, the second insulating film 8 including the hollowed portion 9 inside is formed in the region where the modulator is formed as shown in FIG. 4, and through etching using the second insulating film 8 as a mask, the concave portion 10 is formed in the transparent waveguide layer 6 and the p-InP upper cladding layer 7 below the hollowed portion 9. Next, the modulator layer 11 having the Al-based material is formed, and etched with the modulator layer 11 formed in the concave portion 10 being covered with the third insulating film 13 as shown in FIG. 6, and the modulator layer 11 formed outside the concave portion 10 is removed. Next, as shown in FIG. 7, the etching is performed with the modulator layer 11 formed in the concave portion 10 being covered with the fourth insulating film 14 to form the ridge of the semiconductor laser without exposing the modulator layer 11 formed in the concave portion 10. In this way, the modulator layer 11 having an Al-based material is not etched when the semiconductor laser ridge is formed, and it is thereby possible to prevent the Al-based material of the modulator from flying and adhering to the side face of the active layer of the semiconductor laser and improve reliability.

In the region where the modulator is formed, the width W3 of the hollowed portion 9 is smaller than the width W2 of the second insulating film 8 and larger than the width W7 of the fifth insulating film 20 (W7<W3<W2). It is thereby possible to trap the modulator layer 11 having the Al-based material in the concave portion 10 and then expose the modulator layer 11 when forming the mesa ridge of the modulator.

Furthermore, in the region where the semiconductor laser is formed, the width W4 of the third insulating film 13 is smaller than the width W2 of the second insulating film 8 and the width W5 of the fourth insulating film 14 is smaller than the width W4 of the third insulating film 13 (W5<W4<W2). By gradually narrowing the mask width, it is possible to accurately form the semiconductor laser ridge.

Note that the present embodiment has described the semiconductor laser as an example of the embedded type optical element, but without being limited to this, a semiconductor optical amplifier may be used as well. Furthermore, the present embodiment has described the MZ modulator as an example of the high mesa type optical element, but without being limited to this, an electric field absorption ridge type modulator (electro-absorption modulator: EAM) may be used as well.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-048615, filed on Mar. 11, 2015 including specification, claims, drawings and summary, on which the Convention priority of the present application is based, is incorporated herein by reference in its entirety.

What is claimed is:

1. A method for manufacturing an optical semiconductor device in which an embedded type optical element using an Al-free based material, a high mesa ridge type optical element, sais high mesa ridge including second and third core layers, second and third upper cladding layers and an embedded layer, using an Al-based material, and a waveguide connecting the embedded type optical element to the high mesa ridge type optical element are integrated together, comprising:
   forming a lower cladding layer, a first core layer using an Al-free based material, and a first upper cladding layer on a substrate in that order;
   in a region where the embedded type optical element is formed, forming a first insulating film on the first upper cladding layer;
   using the first insulating film as a mask and etching the first core layer and the first upper cladding layer;
   in a region other than the first insulating film, selectively forming a second core layer using an Al-free based material, and a second upper cladding layer on the lower cladding layer in that order;
   after the first insulating film is removed, in a region where the embedded type optical element, the high mesa ridge type optical element and the waveguide are formed, on the first and second upper cladding layers, forming a second insulating film including a hollowed portion inside in a region where the high mesa ridge type optical element is formed;
   using the second insulating film as a mask and etching the first and second core layers and the first and second upper cladding layers to form a concave portion in the second core layer and the second upper cladding layer below the hollowed portion;
   in a region other than the second insulating film, selectively forming a third core layer using an Al-based material, and a third upper cladding layer on the lower cladding layer in that order;
   after the second insulating film is removed, in a region where the embedded type optical element, the high mesa ridge type optical element, and the waveguide are formed, forming a third insulating film on the first, second and third upper cladding layers and covering the third core layer and the third upper cladding layer formed in the concave portion with the third insulating film;
   using the third insulating film as a mask and etching the first, second and third core layers and the first, second and third upper cladding layers to remove the third core layer and the third upper cladding layer formed outside the concave portion;
   after the third insulating film is removed, in a region where the embedded type optical element, the high mesa ridge type optical element, and the waveguide are formed, forming a fourth insulating film on the first, second and third upper cladding layers and covering the third core layer and the third upper cladding layer formed in the concave portion with the fourth insulating film;
   using the fourth insulating film as a mask and etching the first and second core layers and the first and second upper cladding layers to form a ridge of the embedded type optical element without exposing the third core layer and the third upper cladding layer formed in the concave portion;
   in a region other than the fourth insulating film, forming an embedded layer on the lower cladding layer and filling both sides of the ridge of the embedded type optical element with the embedded layer;
   after the fourth insulating film is removed, in a region where the embedded type optical element, the high mesa ridge type optical element and the waveguide are formed, forming a fifth insulating film on the first, second and third upper cladding layers and the embedded layer; and
   using the fifth insulating film as a mask and etching the second and third core layers, the second and third upper cladding layers and the embedded layer to form a high mesa ridge of the high mesa ridge type optical element.

2. The method for manufacturing an optical semiconductor device of claim 1, wherein in a region where the high mesa ridge type optical element is formed, a width of the hollowed portion is narrower than a width of the second insulating film and is wider than a width of the fifth insulating film.

3. The method for manufacturing an optical semiconductor device of claim 1, wherein in a region where the embedded type optical element is formed, a width of the third insulating film is narrower than a width of the second insulating film, a width of the fourth insulating film is narrower than a width of the third insulating film.

4. The method for manufacturing an optical semiconductor device of claim 1, wherein the embedded type optical element is a semiconductor laser or a semiconductor optical amplifier.

5. The method for manufacturing an optical semiconductor device of claim 1, wherein the high mesa ridge type optical element is a Mach-Zehnder (MZ) modulator or an electro-absorption modulator (EAM).

6. The method for manufacturing an optical semiconductor device of claim 1, wherein the substrate is InP, the high mesa ridge type optical element uses AlGaInAs material, and the embedded type optical element and the waveguide use InGaAsP material.

* * * * *